United States Patent
Han et al.

(10) Patent No.: US 9,224,913 B2
(45) Date of Patent: Dec. 29, 2015

(54) NEAR UV LIGHT EMITTING DEVICE

(71) Applicant: Seoul Viosys Co., Ltd., Ansan-si (KR)

(72) Inventors: Chang Suk Han, Ansan-si (KR); Hwa Mok Kim, Ansan-si (KR); Hyo Shik Choi, Ansan-si (KR); Mi So Ko, Ansan-si (KR); A Ram Cha Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 19 days.

(21) Appl. No.: 13/853,361

(22) Filed: Mar. 29, 2013

(65) Prior Publication Data

US 2013/0256630 A1  Oct. 3, 2013

(30) Foreign Application Priority Data

Mar. 29, 2012 (KR) .................. 10-2012-0032195
Mar. 12, 2013 (KR) .................. 10-2013-0025989

(51) Int. Cl.
*H01L 33/06* (2010.01)
*H01L 33/32* (2010.01)
*H01L 33/04* (2010.01)
*H01L 33/14* (2010.01)

(52) U.S. Cl.
CPC ................ *H01L 33/06* (2013.01); *H01L 33/32* (2013.01); *H01L 33/04* (2013.01); *H01L 33/14* (2013.01)

(58) Field of Classification Search
CPC ......... H01L 33/06; H01L 33/32; H01L 33/04; H01L 2924/0002; H01L 2924/00; H01L 33/0075; H01L 21/02458; B82Y 20/00
USPC .............................. 257/13, 15, E33.02, 79, 25
See application file for complete search history.

(56) References Cited

U.S. PATENT DOCUMENTS

| | | | |
|---|---|---|---|
| 2011/0017976 A1* | 1/2011 | Khan et al. ....................... | 257/13 |
| 2011/0140079 A1* | 6/2011 | Jang et al. ........................ | 257/13 |
| 2011/0253974 A1* | 10/2011 | Horie et al. ..................... | 257/13 |

* cited by examiner

*Primary Examiner* — Chuong A Luu
*Assistant Examiner* — Rodolfo Fortich
(74) *Attorney, Agent, or Firm* — H.C. Park & Associates, PLC

(57) ABSTRACT

Disclosed herein is an ultraviolet (UV) light emitting device. The light emitting device includes an n-type contact layer including a GaN layer; a p-type contact layer including a GaN layer; and an active layer of a multi-quantum well structure disposed between the n-type contact layer and the p-type contact layer, the active area configured to emit near ultraviolet light at wavelengths of 365 nm to 309 nm.

10 Claims, 3 Drawing Sheets

NEAR UV LIGHT EMITTING DEVICE

CROSS-REFERENCE TO RELATED APPLICATIONS

This application claims priority from and the benefit of Korean Patent Application No. 10-2012-0032195, filed on Mar. 29, 2012, and Korean Patent Application No. 10-2013-0025989, filed on Mar. 12, 2013, which are incorporated by reference for all purposes as if fully set forth herein.

BACKGROUND

1. Field

The present invention relates to an inorganic semiconductor light emitting device, and more particularly, to a near ultraviolet light emitting device.

2. Discussion of the Background

Generally, a gallium nitride-based semiconductor has been widely used in a blue/green light emitting diode or a laser diode as a light source of full color displays, traffic lighting, general lamps and optical communication instruments. In particular, an indium gallium nitride (InGaN) compound semiconductor has attracted considerable attention due to its narrow band gap.

This gallium nitride-based compound semiconductor has been utilized in various fields such as large-sized natural color flat panel display devices, light sources of backlight units, traffic lights, indoor lighting fixtures, high density light sources, high resolution output systems, optical communication, and the like. A light emitting device for emitting near ultraviolet light has been used in forgery discrimination, resin curing and ultraviolet treatment, and can realize various colors of visible light in combination with a fluorescent substance.

Near ultraviolet light refers to ultraviolet light at wavelengths ranging from about 320 nm to 390 nm. Gallium nitride GaN has an energy band gap of about 3.42 eV, which correspond to optical energy at a wavelength of about 365 nm. Accordingly, a light emitting device including an InGaN well layer can be used to emit near ultraviolet light at wavelengths of 365 nm or greater, that is, wavelengths from 365 nm to 390 nm according to In content.

Since light produced in the well layer is emitted to the outside through a barrier layer and a contact layer, a plurality of semiconductor layers is located in a path along which light travels, and light absorption occurs due to the semiconductor layers. In particular, when the semiconductor layers have a band gap smaller than or similar to those of the well layers, significant light loss occurs. In particular, it is necessary to control light absorption due to an n-type contact layer and a p-type contact layer occupying most of the thickness of the light emitting device.

Thus, in the near ultraviolet light emitting device in the related art, barrier layers, n-type contact layers, and p-type contact layers as well as electron blocking layers are formed of AlGaN which has a greater band gap than InGaN. However, since it is difficult to grow AlGaN relatively thick while ensuring good crystallinity of AlGaN, electric and optical characteristics of the near ultraviolet light emitting device are inferior to those of blue light emitting devices, and the near ultraviolet light emitting device is sold at a higher price than blue/green light emitting devices.

SUMMARY

An aspect of the present invention is to improve light output and light extraction efficiency of a gallium nitride-based near ultraviolet light emitting device.

Another aspect of the present invention is to provide a near ultraviolet light emitting device which can be easily manufactured.

Additional features of the invention will be set forth in the description which follows, and in part will be apparent from the description, or may be learned by practice of the invention.

In accordance with one aspect of the present invention, a light emitting device includes: an n-type contact layer including a GaN layer; a p-type contact layer including a GaN layer; and an active layer of a multi-quantum well structure placed between the n-type contact layer and the p-type contact layer. The active area of the multi-quantum well structure emits near ultraviolet light at wavelengths from 365 nm to 309 nm.

The active area of the multi-quantum well structure may include barrier layers and well layers. The barrier layers may be formed of AlGaN. Since the barrier layers contain In, it possible to relieve lattice mismatch between the well layers and the barrier layers.

In addition, a first barrier layer closest to the n-type contact layer may contain 10~20% more Al than the other barrier layers. The first barrier layer is formed of AlInGaN having a lower lattice parameter than the other barrier layers, thereby improving light output of the light emitting device. Herein, the metal element content represented by percentage is a composition of each metal component with respect to the total amount of metal components in a gallium nitride-based layer. In other words, the Al content of the gallium nitride-based layer represented by $Al_xIn_yGa_zN$ is represented by % according to $100 \times x/(x+y+z)$.

The well layers may be formed of InGaN and emit near ultraviolet light at wavelengths from 375 nm to 390 nm, and the barrier layers except for the first barrier layer may be formed of AlInGaN containing 15% to 25% of Al and 1% or less of In. In addition, the first barrier layer may be formed of AlInGaN containing 30% to 40% of Al and 1% or less of In.

In some embodiments, the p-type contact layer may include a lower high-density doping layer, an upper high-density doping layer, and a low-density doping layer placed between the upper and lower high-density doping layers. In addition, the low-density doping layer is thicker than the upper and lower high-density doping layers. The relatively thick thickness of the low-density doping layer may serve to prevent light absorption by the p-type contact layer.

Further, the n-type contact layer may include a lower gallium nitride layer, an upper gallium nitride layer, and an intermediate layer of a multilayer structure placed between the upper and lower gallium nitride layers. The intermediate layer of the multilayer structure inserted into an intermediate section of the n-type contact layer may improve crystal quality of epitaxial layers on the n-type contact layer. In particular, the intermediate layer of the multilayer structure may have a structure in which AlInN and GaN are alternately stacked one above another.

The light emitting device may further include a superlattice layer between the n-type contact layer and the active area; and an electron implantation layer between the superlattice layer and the active area. Here, the electron implantation layer has a higher n-type impurity doping density than the superlattice layer. The electron implantation layer allows electrons to be efficiently implanted into the active area, thereby improving light emitting efficacy.

In a certain embodiment, the superlattice layer may have a structure in which InGaN/InGaN is repeatedly stacked, and the electron implantation layer may be formed of GaN or InGaN. Here, InGaN/InGaN represents that each layer in a cycle of layers constituting the superlattice layer is formed of InGaN. Here, each of these layers does not need the same content of In.

An undoped GaN layer may be placed between the n-type contact layer and the superlattice layer. The undoped GaN layer may adjoin the n-type contact layer and may recover crystal quality of the n-type contact layer, which can be deteriorated by impurity doping.

Further, the light emitting device may further include a low-density GaN layer placed between the undoped GaN layer and the superlattice layer and doped with n-type impurities at a lower density than the n-type contact layer; and a high-density GaN layer placed between the low-density GaN layer and the superlattice layer and doped with n-type impurities at a higher density than the low-density GaN layer.

It is to be understood that both the foregoing general description and the following detailed description are exemplary and explanatory and are intended to provide further explanation of the invention as claimed.

BRIEF DESCRIPTION OF THE DRAWINGS

The above and other aspects, features, and advantages of the present invention will become apparent from the detailed description of the following embodiments in conjunction with the accompanying drawings, in which.

DETAILED DESCRIPTION OF THE ILLUSTRATED EMBODIMENTS

Figure 1:
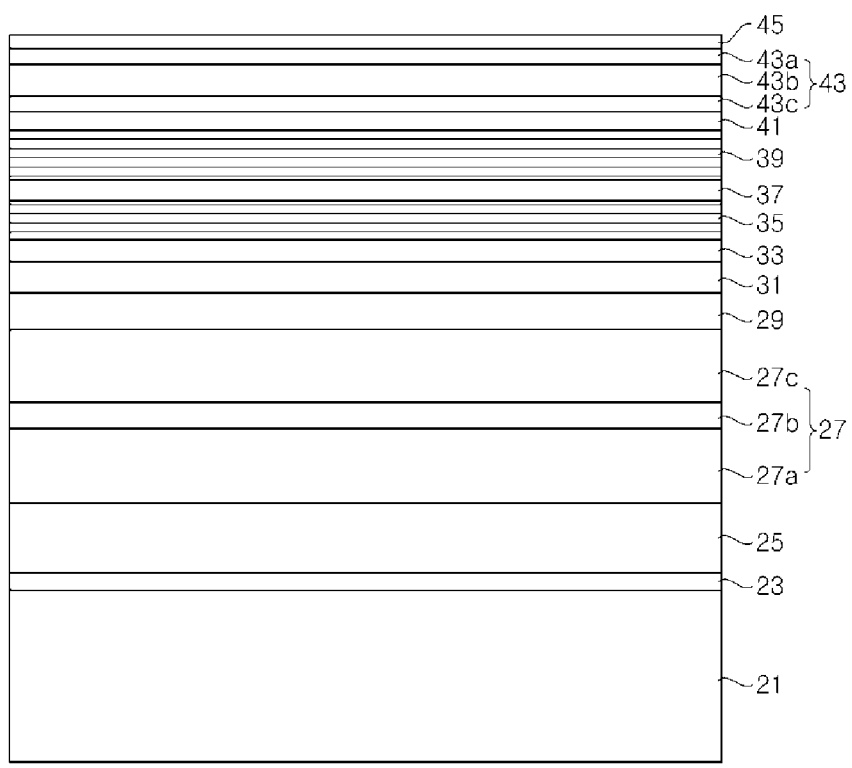
FIG. 1 is a sectional view of a light emitting device according to one exemplary embodiment of the present invention.

Hereinafter, exemplary embodiments of the invention will be described in detail with reference to the accompanying drawings. The following embodiments are given by way of illustration to provide a thorough understanding of the present invention to those skilled in the art. Thus, the present invention is not limited to the following embodiments, and may be realized in various ways. It should be noted that the drawings are not to precise scale and some of the dimensions, such as width, length, thickness, and the like, are exaggerated for clarity of description in the drawings. Like elements are denoted by like reference numerals throughout the specification and drawings.

Figure 2:
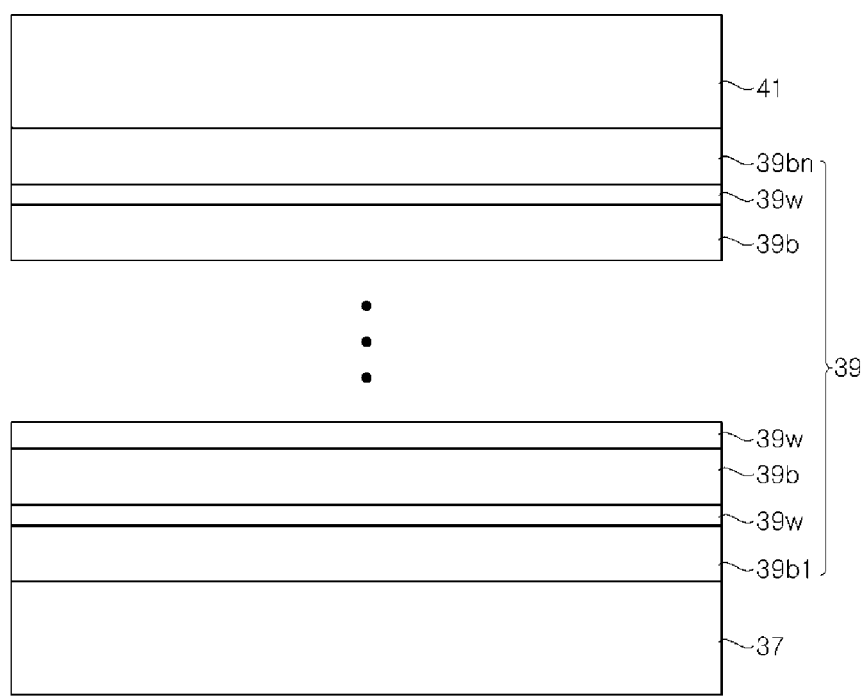
FIG. 2 is a sectional view of a multi-quantum well structure of the light emitting device according to the exemplary embodiment of the present invention.

FIG. 1 is a sectional view of a light emitting device according to one exemplary embodiment of the present invention, and FIG. 2 is a sectional view of a multi-quantum well structure of the light emitting device according to the exemplary embodiment of the present invention.

Referring to FIG. 1, a light emitting device according to one embodiment includes an n-type contact layer 27, an active area 39, and a p-type contact layer 43. Further, the light emitting device may include a substrate 21, a nucleation layer 23, a buffer layer 25, an undoped GaN layer 29, a low-density GaN layer 31, a high-density GaN layer 33, a superlattice layer 35, an electron implantation layer 37, an electron blocking layer 41, or a delta doping layer 45.

The substrate 21 is a substrate for growing a GaN-based semiconductor layer, and includes a sapphire substrate, a silicon carbide (SiC) substrate, or a spinel substrate, without being limited thereto. For example, the substrate 21 may be a patterned sapphire substrate (PSS).

The nucleation layer 23 may be formed of (Al, Ga)N, at temperatures ranging from 400° C. to 600° C., to grow the buffer layer 25 on the substrate 21. The nucleation layer 23 is formed of GaN or AN. The nucleation layer 23 may be formed to a thickness of about 25 nm. The buffer layer 25 is grown at relatively high temperatures to relieve defect occurrence, such as dislocation, between the substrate 21 and the n-type contact layer 27. For example, the buffer layer 25 may be formed of undoped GaN and may have a thickness of about 1.5 μm.

The n-type contact layer 27 may be an n-type impurity-doped semiconductor layer, for example, Si-doped, GaN-based semiconductor layer, and may be formed to a thickness of about 3 μm. The n-type contact layer 27 may include a GaN layer and may have a single layer or multilayer structure. For example, as shown, the n-type contact layer 27 may include a lower GaN layer 27a, an intermediate layer 27b, and an upper GaN layer 27c. Here, the intermediate layer 27b may be formed of AlInN, or may have a multilayer structure (including a superlattice structure) in which AlInN and GaN are alternately stacked, for example, in about 10 cycles. The lower GaN layer 27a and the upper GaN layer 27c may be formed to similar thicknesses of, for example, about 1.5 μm. The intermediate layer 27b may be formed to a smaller thickness than the s lower and the upper GaN layers 27a, 27c. For example, the intermediate layer 27b may have a thickness of about 80 nm. As compared with the case where a single GaN layer is continuously grown at a relatively high thickness of about 3 mm, the intermediate layer 27b is inserted into an intermediate section of the n-type contact layer 27.

As such, crystal quality of an epitaxial layer, specifically, the active area 39 formed on the n-type contact layer 27, can be improved. A doping density of Si doped into the n-type contact layer 127 may range from $2 \times 10^{18}/cm^3$ to $2 \times 10^{19}/cm^3$, or from $1 \times 10^{18}/cm^3$ to $2 \times 10^{19}/cm^3$. In particular, the lower GaN layer 27a and the upper GaN layer 27c may be doped with Si impurities at a high density, and the intermediate layer 27b may be doped with the Si impurities at a lower or the same density as that of the upper GaN 27c, or may not be intentionally doped therewith. Since the lower GaN layer 27a and the upper GaN layer 27c are doped with the Si impurities at a high density, the resistance of the n-type contact layer 27 may be reduced. An electrode contacting the n-type contact layer 27 may contact the upper GaN layer 27c as well.

The undoped GaN layer 29 may be formed of GaN that is not doped with the impurities, and may be formed to a smaller thickness than the upper GaN layer 27c. For example, the undoped GaN layer 29 may have a thickness of 80 nm to 300 nm. As the n-type contact layer 27 is doped with n-type impurities, the n-type contact layer 27 has residual stress and a low crystal quality. Accordingly, when another epitaxial layer is grown on the n-type contact layer 27, it is difficult to grow an epitaxial layer having good crystal quality. However, since the undoped GaN layer 29 is not doped with any impurity, the undoped GaN layer 29 acts as a recovery layer for recovering the crystal quality of the n-type contact layer 27. Thus, the undoped GaN layer 29 may be directly formed on the n-type contact layer 27 to adjoin the n-type contact layer 27. In addition, since the undoped GaN layer 28 has a higher resistivity than the n-type contact layer 27, electrons introduced from the n-type contact layer 27 to the active layer 39 can be evenly distributed within the n-type contact layer 27, before passing through the undoped GaN layer 29.

The low-density GaN layer 31 is placed on the undoped GaN layer 29 and has a lower n-type impurity doping density than the n-type contact layer 27. The low-density GaN layer 31 may have a Si doping density ranging, for example, from $5 \times 10^{17}/cm^3$ to $5 \times 10^{18}/cm^3$ and may be formed to a smaller thickness than the undoped GaN layer 29. For example, the low-density GaN layer 31 may have a thickness of 50 nm to 150 nm. The high-density GaN layer 33 is placed on the low-density GaN layer 31 and has a higher n-type impurity doping density than the low-density GaN layer 31. The high-density GaN layer 33 may have an Si doping density similar to that of the n-type contact layer 27. The high-density GaN layer 33 may have a smaller thickness than the low-density GaN layer 31. For example, the high-density GaN layer 33 may have a thickness of about 30 nm.

The n-type contact layer 27, the undoped GaN layer 29, the low-density GaN layer 31, and the high-density GaN layer 33 may be continuously grown by supplying a metal source gas into a chamber. Organometallic materials including Al, Ga and In, such as trimethylaluminum (TMA), trimethylgallium (TMD), and/or trimethlyindium (TME), are used as a metal source gas. Silane $SiH_4$ may be used as a source gas of Si. These layers may be grown at a first temperature of, for example, 1050° C. to 1150° C.

The superlattice layer 35 is placed on the high-density GaN layer 33. The superlattice layer 35 may be formed by alternately stacking first and second InGaN layers having different compositions in about 30 cycles, in which each of the InGaN layers has a thickness of 20 Å. The indium content of the first and second InGaN layers is lower than that of well layers 39w in the active area 39. The superlattice layer 35 may be formed of an undoped layer without any intentionally doped impurities. Since the superlattice layer 35 is formed of the undoped layer, current leakage of the light emitting device can be reduced.

The electron implantation layer 37 has a higher n-type impurity doping density than the superlattice layer 35. In addition, the electron implantation layer 37 may have substantially the same n-type impurity doping density as the n-type contact layer 27. For example, the n-type impurity doping density may range from $1 \times 10^{19}/cm^3$ to $5 \times 10^{19}/cm^3$, or from $1 \times 10^{19}/cm^3$ to $3 \times 10^{19}/cm^3$. Since the electron implantation layer 37 is doped at a high density, implantation of electrons into the active area 39 can be facilitated. The electron implantation layer 37 may be formed to a similar or smaller thickness than the high-density doping layer 33. For example, the electron implantation layer 37 may have a thickness of 20 nm. Moreover, the electron implantation layer 37 may be grown at a pressure of about 300 torr and a temperature of about 820° C. to 850° C.

The active area 39 is placed on the electron implantation layer 37. FIG. 2 is an enlarged sectional view of the active area 39.

Referring to FIG. 2, the active area 39 has a multi-quantum well structure including barrier layers 39b and well layers 39w, which are alternately stacked one above another. The well layers 39w have a composition capable of emitting near-ultraviolet light ranging from 365 nm to 390 nm. For example, the well layers 39w may be formed of InGaN or AlInGaN, for example. Here, the In content of the well layers 39w is determined according to wavelengths of ultraviolet light. For example, the In content of the well layers 39w may range from about 2% to 5% molar percentage (accordingly, the Ga content ranges from about 95% to 98%). Throughout the present description, content of a compound in the various layers is likewise indicated according to molar percentage. Each of the well layers 39w may have a thickness of about 20 Å to 30 Å. The well layers 39w may be grown at a higher temperature than the well layers of a general blue light emitting diode, for example, 800° C. to 820° C., at a pressure of about 300 Torr. As such, the well layers may have improved crystal quality.

The barrier layers 39b may be formed of gallium nitride-based semiconductor layers having a wider band gap than the well layers. For example, the barrier layers may be formed of GaN, InGaN, AlGaN, or AlInGaN. In particular, since the barrier layers 39b may be formed of AlInGaN and thus, contain In, a lattice mismatch between the well layers 39w and the barrier layers 39b can be relieved.

Furthermore, the barrier layers 39b may be grown at a slightly higher growth temperature than the growth temperature of the well layers 39w. For example, the barrier layers 39b may be grown at temperatures of about 820° C. to 850° C., at a pressure of about 300 Torr.

A first barrier layer 39b1 of the barrier layers 39b1, 39b, 39bn, which is closest to the electron implantation layer 37 or the n-type contact layer 27, has a higher Al content than the other barrier layers. For example, the first barrier layer 39b1 may contain 10% to 20% more Al than the other barrier layers 39b. For example, when the other barrier layers 39b, 39bn include about 20% of Al, the first barrier layer 39b1 may include about 30% to 40% of Al. The barrier layers 39b1, 39b, 39bn contain about 1% or less of indium. In particular, when the well layers 39b are formed of InGaN to emit near-ultraviolet light of 375 nm to 390 nm, the barrier layers 39b and 39bn other than the first barrier layer 39b1 may be formed of AlInGaN which contains 15% to 25% of Al and about 1% or less of In, and the first barrier layer 39b may be formed of AlInGaN which contains 30% to 40% of Al and 1% or less of In.

In general, barrier layers are formed to have the same composition in a light emitting device. However, in the present embodiment, the first barrier layer 39b1 contains 10% to 20% more Al than the other barrier layers 39b. The electron implantation layer 37 or the n-type contact layer 27 is formed of GaN. A difference between band gaps of the well layer 39w capable of emitting near-ultraviolet light and GaN is not relatively large. Accordingly, the first barrier layer 39b1 is formed to have a higher band gap than the other barrier layers 39b, thereby confining carriers in the active area 39. In particular, when the AlInGaN barrier layer is used, a moving speed of holes is significantly decreased, whereby an overflow probability of electrons can be increased. In this case, although it can be considered that the thickness of the electron blocking layer 41 is increased to prevent overflow of electrons, an increase in thickness of the electron blocking layer 41 for efficient implantation of holes into the active area is restricted.

Accordingly, the first barrier layer 39b1 is formed to have a wider band gap (about 0.5 eV or higher) than the other barrier layers, to effectively prevent the overflow of electrons, by decreasing the moving speed of the electrons. However, when the Al content of the first barrier layer 39b1 is increased by about 20% or more, a lattice mismatch may occur between the first barrier layer 39b1 and the electron implantation layer 37, and a lattice mismatch between the first barrier layer 39b1 and the well layer 39w may become severe, thereby reducing the crystal quality of the active area 39.

The first barrier layer may have substantially the same or greater thickness (for example, of about 40 Å) than the other barrier layers except for the last barrier layer, which is closest to the electron blocking layer 41 or the p-type contact layer 43. For example, the first barrier layer may have a thickness of 40 Å to 60 Å, specifically about 45 Å.

The active area 39 may adjoin the electron implantation layer 37. The barrier layer and the quantum well layer of the active area 39 may be formed of an undoped layer to improve the crystal quality of the active layer, and some portion or the entirety of the active area may be doped with impurities to reduce forward voltage.

Referring again to FIG. 1, the p-type contact layer 43 may be placed on the active area 39, and the electron blocking layer 41 may be placed between the active area 39 and the p-type contact layer 43. The electron blocking layer 41 may be formed of AlGaN or AlInGaN, to relieve lattice mismatch between the p-type contact layer and the active area 39. The electron blocking layer 41 may contain 36% of Al and 3% of In. The electron blocking layer 41 may be doped with p-type impurities, for example Mg, at a doping density of $5\times10^{19}/cm^3$ to $2\times10^{20}/cm^3$.

The p-type contact layer 43 may include a lower high-density doping layer 43a, a low-density doping layer 43b, and an upper high-density doping layer 43c.

The lower high-density doping layer 43a and the upper high-density doping layer 43c may be doped with p-type impurities, for example Mg, at a doping density of $5\times10^{19}/cm^3$ to $2\times10^{20}/cm^3$. The low-density doping layer 43b has a lower doping density than the lower and upper high-density doping layers 43a, 43c and is placed therebetween. The low-density doping layer 43b may be grown, with the supply of a source gas Mg (for example, $Cp_2Mg$) interrupted during growth thereof.

During growth of the low-density doping layer 43b, the impurity content may be reduced using $N_2$ gas as a carrier gas instead of using $H_2$. The low-density doping layer 43b is formed to a greater thickness than the upper and lower high-density doping layers 43c, 43a. For example, the low-density doping layer 43b may be formed to a thickness of about 60 nm, and each of the upper and lower high-density doping layers 43c, 43a may be formed to a thickness of 10 nm. As a result, the p-type contact layer 43 has improved crystal quality and a reduced impurity density, thereby preventing or relieving the loss of near-ultraviolet light due to the p-type contact layer 43.

The delta doping layer 45 may be placed on the p-type contact layer 43 to decrease ohmic contact resistance. The delta doping layer 45 is doped with p-type or n-type impurities at a high density to decrease the ohmic resistance between the electrode and the p-type contact layer 43. The delta doping layer 45 may be formed to a thickness of about 2Å to 5 Å.

A light emitting device of a lateral structure or flip chip structure can be manufactured by patterning the epitaxial layers on the substrate 21. Further, a light emitting device of a vertical structure can be manufactured by removing the substrate 21.

EXPERIMENTAL EXAMPLE 1

Figure 3:
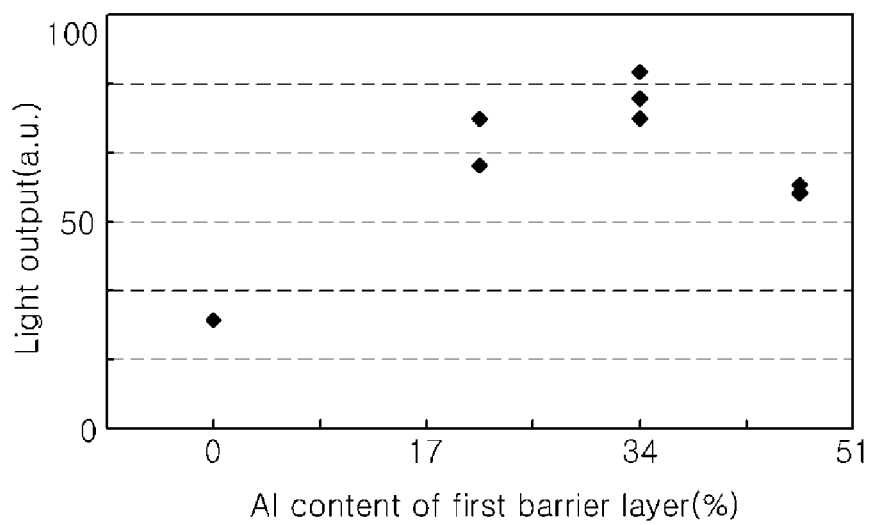
FIG. 3 is a graph depicting light output versus Al content of a first barrier layer of the multi-quantum well structure of the light emitting device according to the exemplary embodiment of the present invention.

In order to check the variation in light output according to the Al content in the first barrier layer 39b closest to the n-type contact layer 27, epitaxial layers were grown by MOCVD under the same conditions, except for the Al content in the first barrier layer. FIG. 3 is a graph depicting light output versus Al content of the first barrier layer. The barrier layers had the same composition except for the first barrier layer. The Al content of the respective barrier layers was measured using an atomic probe, and the other barrier layers contained about 20% of Al.

Referring to FIG. 3, when the Al content of the first barrier layer was 14% higher than those of the other barrier layers, the light emitting device had relatively high light output. On the other hand, when the first barrier layer did not contain Al, the light emitting device had relatively low light output. In addition, when the first barrier layer contained about 47% of Al, which was 27% higher than the Al content of the other barrier layers, a light emitting device sample had smaller light output than other light emitting device samples wherein the first barrier layer had the same Al content than the other barrier layers.

EXPERIMENTAL EXAMPLE 2

Figure 4:
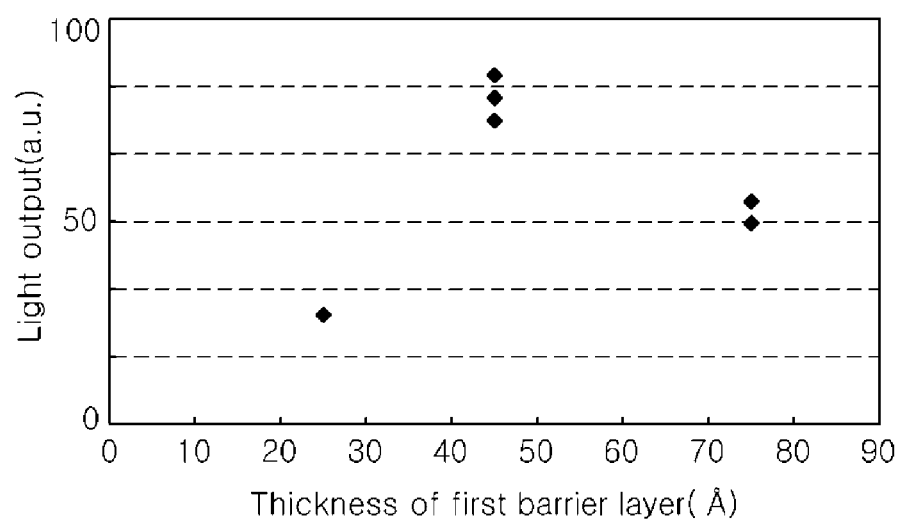
FIG. 4 is a graph depicting light output versus thicknesses of the first barrier layer of the multi-quantum well structure of the light emitting device according to the exemplary embodiment of the present invention.

In order to check light variation in light output according to the thickness of the first barrier layer 39b closest to the n-type contact layer 27, epitaxial layers are grown by MOCVD under the same conditions except for the thickness of the first barrier layer. FIG. 4 is a graph depicting light output versus thickness of the first barrier layer. All of the barrier layers except for the first barrier layer and the last barrier layer closest to the p-type contact layer 43 were formed to a thickness of about 45 Å, and the last barrier layer was formed to a relatively thick thickness of about 75 Å. Moreover, the first barrier layer had an Al content of about 34%, and the other barrier layers had an Al content of about 20%.

Referring to FIG. 4, when the first barrier layer had a thickness of 45 Å, which is the same as the other barrier layers, the light emitting device had relatively high light output. On the other hand, when the first barrier layer had a thickness of 25 Å, the light emitting device had relatively low light output, and even in the case where the first barrier layer had a thick thickness of 75 Å, the light emitting device had relatively low light output.

In a near ultraviolet light emitting device in the related art, an n-type contact layer is formed of AlGaN. Since a contact layer occupying most of the thickness of the near UV light emitting device except for the substrate is formed of AlGaN, light loss by light absorption can be prevented, but it is difficult to improve light output or light extraction efficiency due to low crystal quality of epitaxial layers therein. According to embodiments, since all or most of n-type contact layers and p-type contact layers are formed of gallium nitride, it is possible to improve crystal quality of an active area. Thus, the light emitting device according to the embodiments may have improved light output by preventing light loss due to light absorption.

Furthermore, since a first barrier layer contains a greater amount of Al than other barrier layers, the light emitting device according to the embodiments may have further improved light output. Moreover, the near ultraviolet light emitting device can reduce light loss due to light absorption by enhancing crystal quality of n-type and p-type contact layers.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:
1. A light emitting device, comprising:
   an n-type contact layer comprising a GaN layer;
   a p-type contact layer comprising a GaN layer;
   an active area comprising barrier layers and well layers that form a multi-quantum well structure disposed between the n-type contact layer and the p-type contact layer, the barrier layers comprising Al, the active area configured to emit near ultraviolet light at wavelengths of 375 nm to 390 nm;

a superlattice layer disposed between the n-type contact layer and the active area; and an electron implantation layer disposed between the superlattice layer and the active area, the electron implantation layer comprising a higher n-type impurity doping density than the superlattice layer, wherein a first one of the barrier layers is disposed closest to the n-type contact layer, comprises 10% to 20% more Al than the other barrier layers, and has at least a 0.5 eV wider band gap than the other barrier layers, and wherein the active layer adjoins the electron implantation layer.

2. The light emitting device of claim 1, wherein the barrier layers except for the first barrier layer comprise AlInGaN comprising 15% to 25% of Al and 1% or less of In.

3. The light emitting device of claim 2, wherein the first barrier layer comprises AlInGaN comprising 30% to 40% of Al and 1% or less of In.

4. The light emitting device of claim 1, wherein the p-type contact layer comprises:
a first high-density doping layer;
a second high-density doping layer; and
a low-density doping layer disposed between the first high-density doping layer and the second high-density doping layer.

5. The light emitting device of claim 4, wherein the low-density doping layer is thicker than the first and second high-density doping layers.

6. The light emitting device of claim 1, wherein the n-type contact layer comprises:
a first GaN layer;
a second GaN layer; and
an intermediate layer comprising a multilayer structure and disposed between the first and second GaN layers.

7. The light emitting device of claim 6, wherein the intermediate layer comprises alternately stacked AlInN and GaN layers.

8. The light emitting device of claim 1, wherein the superlattice layer comprises a sequentially stacked InGaN/InGaN structure, and the electron implantation layer comprises GaN or InGaN.

9. The light emitting device of claim 1, further comprising an undoped GaN layer disposed between the n-type contact layer and the superlattice layer.

10. The light emitting device of claim 9, further comprising:
a low-density GaN layer disposed between the undoped GaN layer and the superlattice layer, the low-density GaN layer being doped with an n-type impurity at a lower density than the n-type contact layer; and
a high-density GaN layer disposed between the low-density GaN layer and the superlattice layer, the high-density GaN layer being doped with an n-type impurity at a higher density than the low-density GaN layer.

* * * * *